United States Patent
Li

(10) Patent No.: US 12,376,279 B2
(45) Date of Patent: Jul. 29, 2025

(54) SEMICONDUCTOR STRUCTURE AND FORMATION METHOD THEREOF

(71) Applicant: CHANGXIN MEMORY TECHNOLOGIES, INC., Hefei (CN)

(72) Inventor: Xiaojie Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 537 days.

(21) Appl. No.: 17/878,046

(22) Filed: Aug. 1, 2022

(65) Prior Publication Data

US 2023/0389263 A1    Nov. 30, 2023

(30) Foreign Application Priority Data

May 24, 2022    (CN) .......................... 202210567847.2

(51) Int. Cl.
*H10B 12/00*      (2023.01)
*H10D 88/00*      (2025.01)

(52) U.S. Cl.
CPC ............. *H10B 12/02* (2023.02); *H10B 12/30* (2023.02); *H10B 12/482* (2023.02); *H10B 12/488* (2023.02); *H10D 88/00* (2025.01)

(58) Field of Classification Search
CPC ...... H10B 12/02; H10B 12/30; H10B 12/482; H10B 12/488
See application file for complete search history.

(56) References Cited

U.S. PATENT DOCUMENTS

| | | | |
|---|---|---|---|
| 10,861,854 B2 | 12/2020 | Kim et al. | |
| 2015/0214243 A1* | 7/2015 | Lee | G11C 16/0483 438/269 |
| 2021/0257366 A1* | 8/2021 | Lee | H10B 12/50 |
| 2022/0199621 A1* | 6/2022 | Lee | H10B 12/03 |
| 2022/0399341 A1* | 12/2022 | Kim | H10B 12/485 |
| 2023/0048424 A1* | 2/2023 | Kim | H10D 30/6757 |
| 2023/0103594 A1* | 4/2023 | Zhang | H10B 12/31 257/296 |
| 2023/0269928 A1* | 8/2023 | Yoon | H10B 12/488 438/239 |
| 2023/0284434 A1* | 9/2023 | Kang | H10D 30/6735 |
| 2023/0363140 A1* | 11/2023 | Shao | H10B 12/30 |
| 2024/0188283 A1* | 6/2024 | Kim | H10B 12/00 |
| 2024/0196592 A1* | 6/2024 | Kim | H10B 12/00 |
| 2025/0056788 A1* | 2/2025 | Yoon | H10B 12/05 |

OTHER PUBLICATIONS

Greenwood (Chemistry of the Elements (2nd edition)). Reed Educational and Professional Publishing Ltd , p. 335-336 (Year: 1997).*

* cited by examiner

Primary Examiner — William B Partridge
Assistant Examiner — Alexandre X Ramirez
(74) Attorney, Agent, or Firm — Kilpatrick Townsend & Stockton LLP

(57) ABSTRACT

Embodiments relates to a semiconductor structure and a formation method thereof. The method for forming a semiconductor structure includes: forming a stacked layer on a top surface of a substrate, where the stacked layer includes a plurality of semiconductor layers spaced along a first direction, the stacked layer includes a transistor region, and a capacitor region and a bit line region; forming a capacitor extending along the second direction in the capacitor region; forming a word line in the transistor region, the word line extending along the first direction; and forming a bit line in the bit line region, the bit line extending along the third direction.

12 Claims, 11 Drawing Sheets

SEMICONDUCTOR STRUCTURE AND FORMATION METHOD THEREOF

CROSS-REFERENCE TO RELATED APPLICATION

This application claims priority to Chinese Patent Application No. 202210567847.2, titled "SEMICONDUCTOR STRUCTURE AND FORMATION METHOD THEREOF" and filed to the State Patent Intellectual Property Office on May 24, 2022, the entire contents of which are incorporated herein by reference.

TECHNICAL FIELD

The present disclosure relates to the field of semiconductor fabrication technology, and more particularly, to a semiconductor structure and a formation method thereof.

BACKGROUND

As a semiconductor apparatus commonly used in an electronic device such as a computer, a dynamic random access memory (DRAM) includes a plurality of memory cells, each of which generally includes a transistor and a capacitor. The transistor has a gate electrically connected to a word line, a source electrically connected to a bit line, and a drain electrically connected to the capacitor. A word line voltage on the word line may control turn-on and turn-off of the transistor, such that data information stored in the capacitor may be read by the bit line or is written into the capacitor.

Semiconductor structures such as DRAM are mostly two-dimensional structures, resulting in low storage density and integration of semiconductor structures, and difficulty in meeting the requirements for memory capacity of semiconductors in different fields.

Therefore, how to increase the integration of a semiconductor structure to improve the performance of the semiconductor structure is a technical problem to be urgently solved at present.

SUMMARY

According to some embodiments, the present disclosure provides a method of forming a semiconductor structure, including:

forming a stacked layer on a top surface of a substrate, the stacked layer comprising a plurality of semiconductor layers spaced along a first direction, the stacked layer comprising a transistor region, and a capacitor region and a bit line region distributed on two opposite sides of the transistor region along a second direction, each of the plurality of semiconductor layers in the transistor region and the capacitor region comprising semiconductor pillars spaced along a third direction, the first direction being a direction perpendicular to the top surface of the substrate, both the second direction and the third direction being directions in parallel to the top surface of the substrate, and the second direction intersecting with the third direction;

forming a capacitor extending along the second direction between adjacent two of the plurality of semiconductor layers in the capacitor region;

forming a word line in the transistor region, the word line extending along the first direction and continuously wrapping the semiconductor pillars spaced along the first direction; and forming a bit line in the bit line region, the bit line extending along the third direction and covering a surface of a given one of the plurality of semiconductor layers.

According to some other embodiments, the present disclosure also provides a semiconductor structure formed by means of the method for forming a semiconductor structure described in any one of the above embodiments.

According to the semiconductor structure and the formation method thereof provided by some embodiments of the present disclosure, a stacked layer is formed on a top surface of a substrate, the stacked layer includes a plurality of semiconductor layers spaced along a direction perpendicular to the top surface of the substrate, and each of the plurality of semiconductor layers includes a plurality of semiconductor pillars spaced along a direction parallel to the top surface of the substrate, such that the plurality of semiconductor pillars in the stacked layer are stacked in a three-dimensional array. Subsequently, a horizontal capacitor, a vertical word line and a horizontal bit line are formed for transforming a conventional two-dimensional semiconductor structure into a three-dimensional semiconductor structure.

DETAILED DESCRIPTION

The embodiments of the semiconductor structure and the formation method thereof provided by the present disclosure will be described in detail below with reference to the accompanying drawings.

Figure 1:
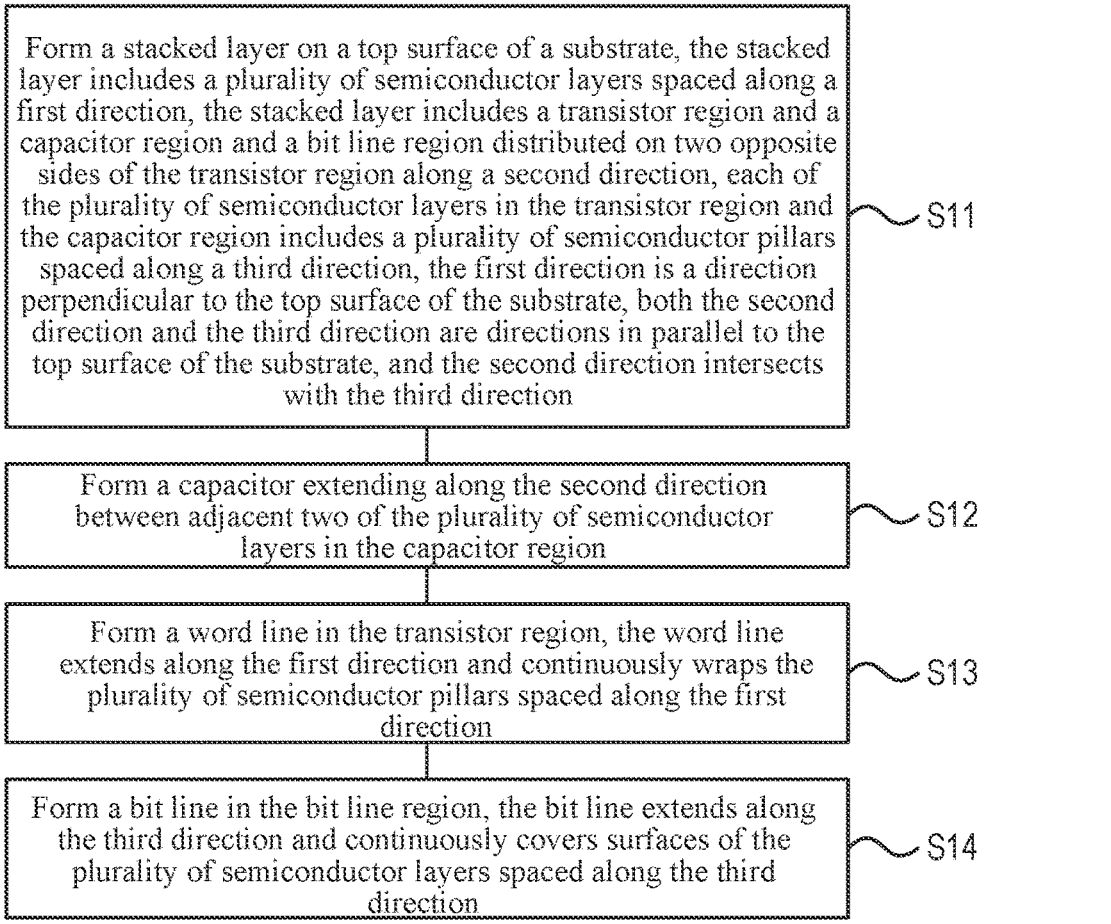
FIG. 1 is a flowchart of a method for forming a semiconductor structure according to an embodiment of the present disclosure.
Figure 2A:
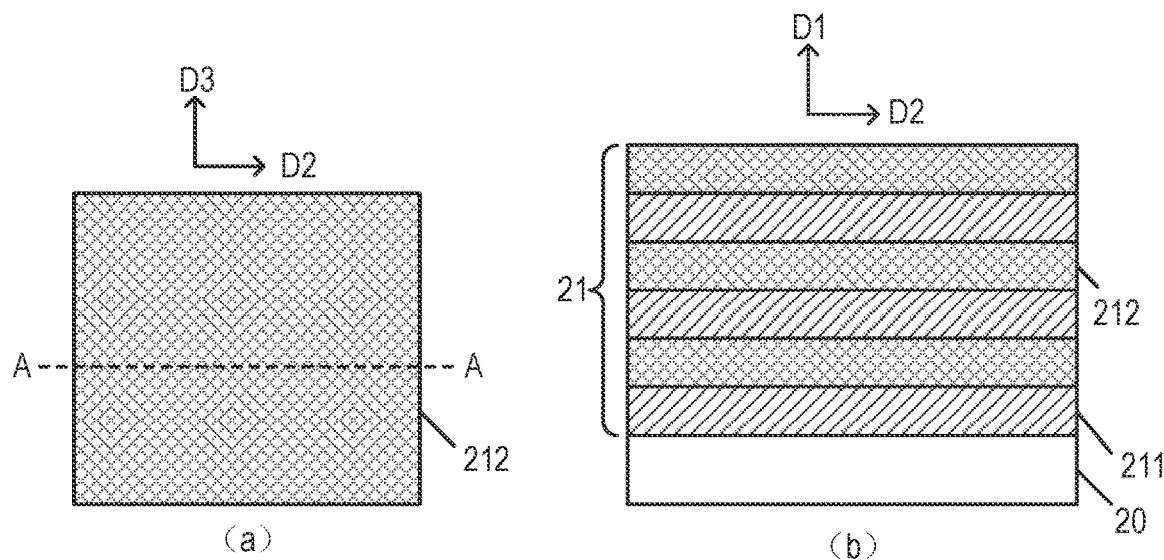
FIGS. 2A-2T are schematic diagrams showing main process structures in a process of forming the semiconductor structure according to some embodiments of the present disclosure.
Figure 2B:
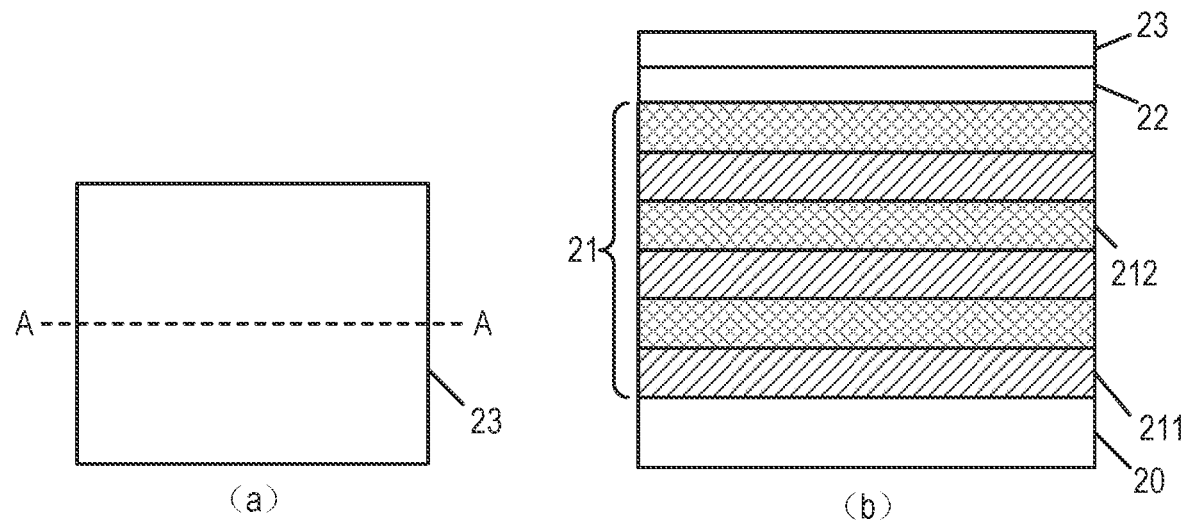

This embodiment provides a method for forming a semiconductor structure. FIG. 1 is a flowchart of a method for forming a semiconductor structure according to an embodiment of the present disclosure. FIGS. 2A-2T are schematic diagrams showing main process structures in a process of forming the semiconductor structure according to some embodiments of the present disclosure. The semiconductor structure described in this embodiment may be, but is not limited to, Dynamic Random Access Memory (DRAM). As shown in FIG. 1 and FIGS. 2A-2T, the method for forming a semiconductor structure includes following steps.

Step S11: forming a stacked layer 21 on a top surface of a substrate 20, where the stacked layer 21 includes a plurality of semiconductor layers 212 spaced along a first direction D1, the stacked layer 21 includes a transistor region, and a capacitor region and a bit line region distributed on two opposite sides of the transistor region along a second direction D2. Each of the plurality of semiconductor layers 212 in the transistor region and the capacitor region includes semiconductor pillars 30 spaced along a third direction D3. The first direction D1 is a direction perpendicular to the top surface of the substrate 20, both the second direction D2 and the third direction D3 are directions in parallel to the top surface of the substrate 20, and the second direction D2 intersects with the third direction D3, as shown in FIG. 2D. In FIG. 2D, (a) is a schematic structural top view, and (b) in FIG. 2D is a schematic cross-sectional view of (a) at AA.

In some embodiments, the step of forming a stacked layer 21 on a top surface of a substrate 20 includes:
  providing the substrate 20;
  alternately forming a first sacrificial layer 211 and the semiconductor layer 212 on the top surface of the substrate 20 along the first direction D1 to form the stacked layer 21, as shown in FIG. 2A, where (a) in FIG. 2A is a schematic structural top view, and (b) in FIG. 2A is a schematic cross-sectional view of (a) at AA; and
  etching the transistor region and the capacitor region of the stacked layer 21 to form a plurality of first trenches exposing the substrate 20, where the plurality of first trenches divides the plurality of semiconductor layers 212 in the transistor region and the capacitor region into the semiconductor pillars 30 spaced along the third direction D3, as shown in FIG. 2D.

In some embodiments, the substrate 20 may be, but is not limited to, a silicon substrate. This embodiment is described by taking an example where the substrate 20 is the silicon substrate. In other examples, the substrate 20 may be a semiconductor substrate made of gallium nitride, gallium arsenide, gallium carbide, silicon carbide or silicon on insulator (SOI). The top surface of the substrate 20 refers to a surface of the substrate 20 configured to form the stacked layer 21. The substrate 20 is configured to support device structures thereon. In an embodiment, the first sacrificial layer 211 and the semiconductor layer 212 may be alternately formed on the top surface of the substrate 20 along the first direction D1 by means of epitaxial growth or atomic layer deposition to form the stacked layer 21, as shown in FIG. 2A. Numbers of first sacrificial layers 211 and the semiconductor layers 212 alternately deposited in the stacked layer 21 may be selected by those skilled in the art according to actual needs. The greater the numbers of the first sacrificial layers 211 and the semiconductor layers 212 alternately deposited in the stacked layer 21 are, the larger the memory capacity of the semiconductor structure formed is. Next, a second sacrificial layer is deposited on the top surface of the stacked layer 21. The second sacrificial layer may be of a single-layer structure or a multi-layer structure. In an embodiment, the second sacrificial layer includes a first pad layer 22 covering the top surface of the stacked layer 21 and a second pad layer 23 positioned on a top surface of the first pad layer 22, as shown in FIG. 2B, where (a) in FIG. 2B is a schematic structural top view, and (b) in FIG. 2B is a schematic cross-sectional view of (a) at AA.

Figure 2C:
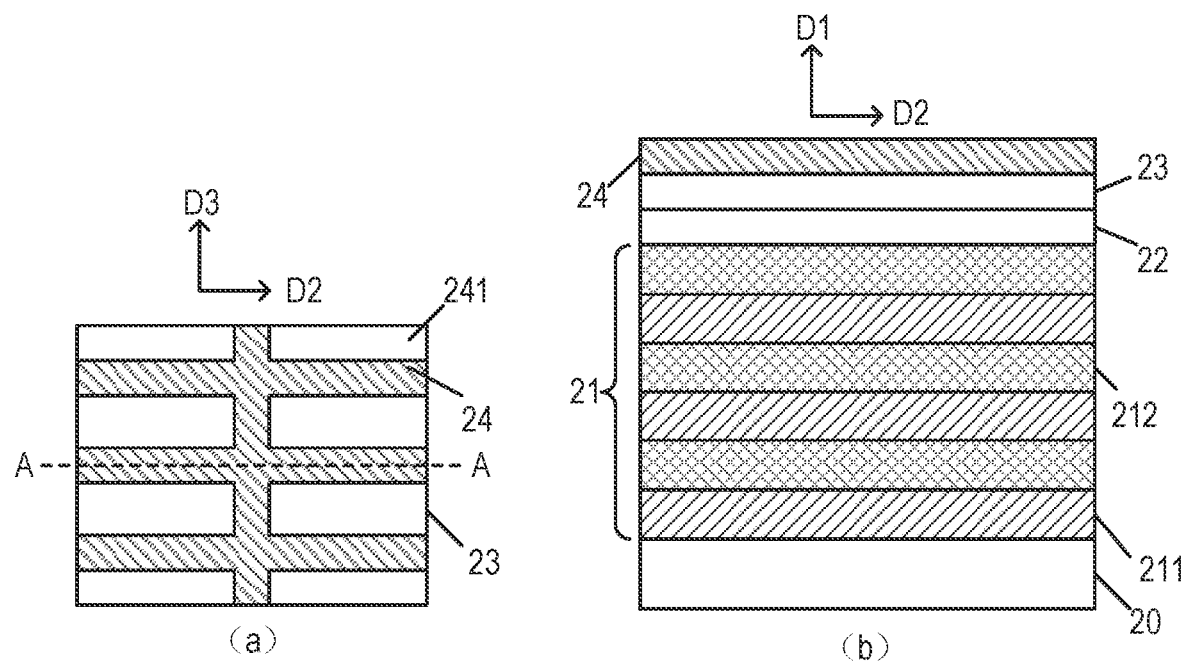
Figure 2D:
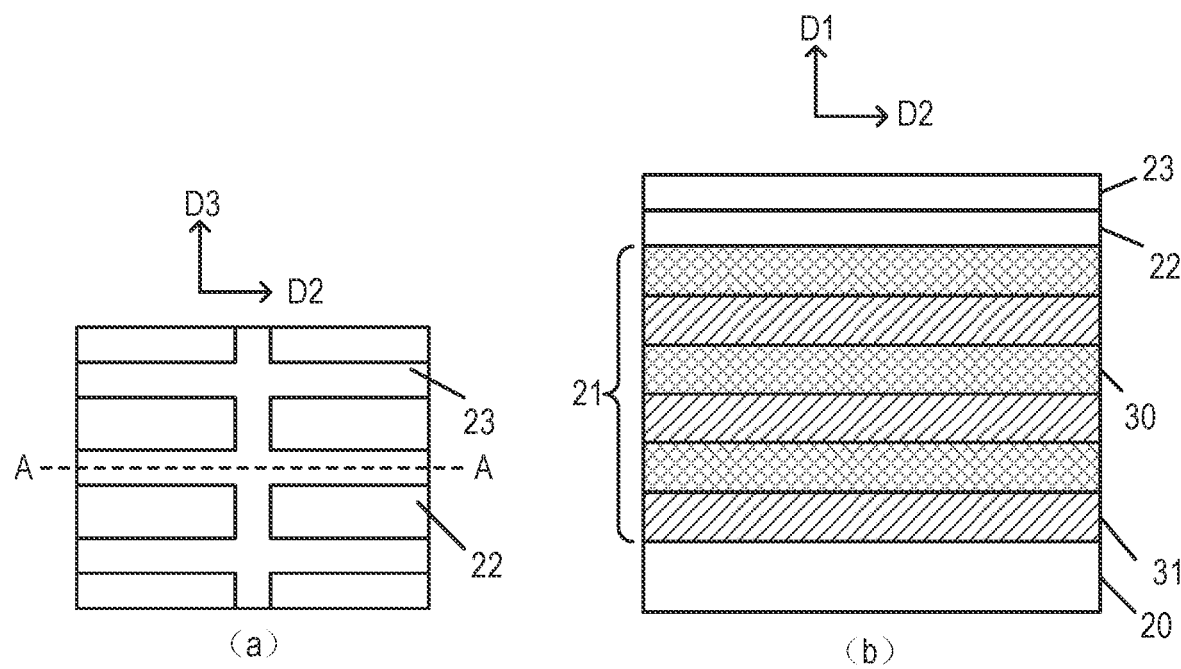
Figure 2E:
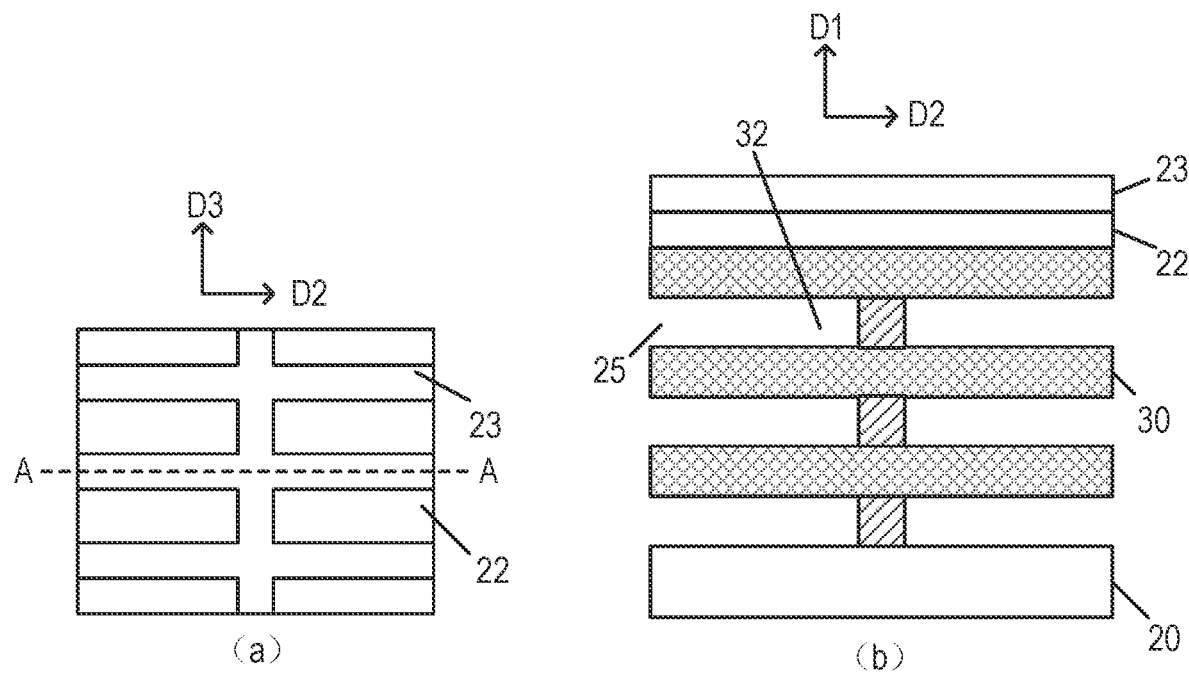
Figure 2F:
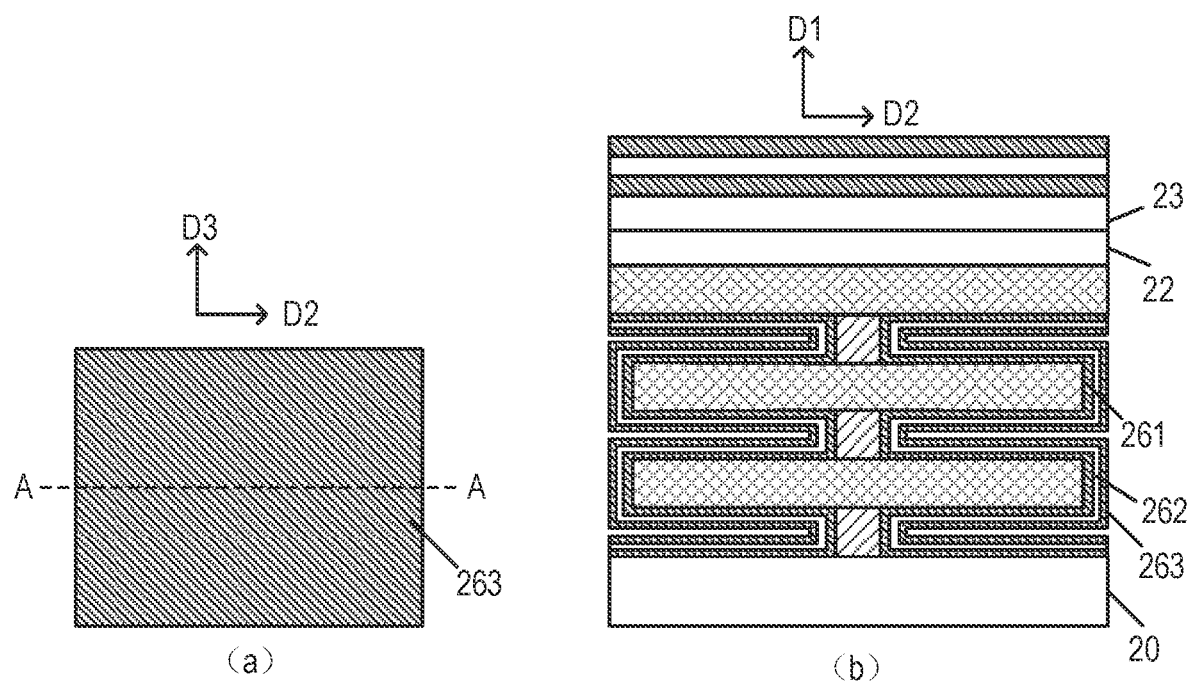
Figure 2G:
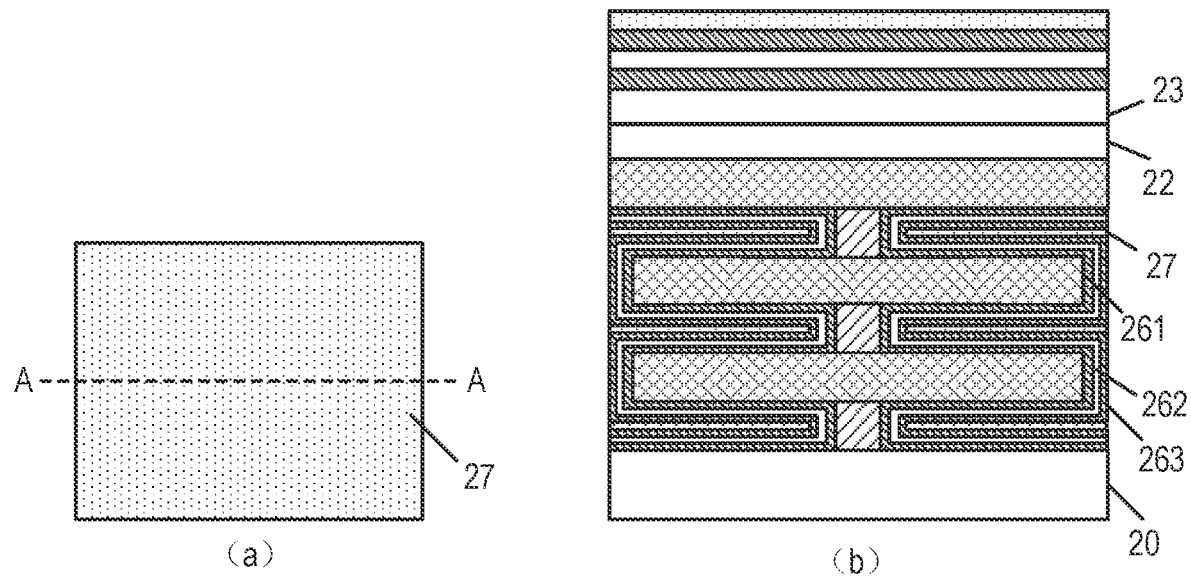

Next, a patterned first photoresist layer 24 is formed on a surface of the second pad layer 23, as shown in FIG. 2C, where (a) in FIG. 2C is a schematic structural top view, and (b) in FIG. 2C is a schematic cross-sectional view of (a) at AA. The first photoresist layer 24 has a first opening 241 therein exposing the second pad layer 23 positioned above the transistor region and the capacitor region. The transistor region and the capacitor region in the second pad layer 23, the first pad layer 22 and the stacked layer 21 are etched down along the first opening 241 to form a plurality of first trenches penetrating through the stacked layer 21 along the first direction D1. By means of the plurality of first trenches, the semiconductor layers 212 in the transistor region and the capacitor region are divided into the plurality of semiconductor pillars 30 spaced along the third direction D3, and the first sacrificial layers 211 in the transistor region and the capacitor region are divided into a plurality of sacrificial pillars 31 spaced along the third direction D3, as shown in FIG. 2D. In one aspect, the first pad layer 22 and the second pad layer 23 are configured to improve shapes of the plurality of first trenches, and in another aspect, the first pad layer 22 and the second pad layer 23 are also configured to protect the semiconductor layer 212 at the top of the stacked layer 21, thereby preventing from causing damage to the semiconductor layer 212 at the top of the stacked layer 21 during an etching process. A material of the first pad layer 22 may be, but not limited to, an oxide material (such as silicon dioxide), and a material of the second pad layer 23 may be, but not limited to, a nitride material (such as silicon nitride). "A plurality of" mentioned in this embodiment refers to two or more.

In this embodiment, only the semiconductor layers 212 in the transistor region and the capacitor region are divided into the plurality of semiconductor pillars 30 spaced along the third direction D3 by means of etching, and the semiconductor layers 212 in the bit line region are not etched. That is, the semiconductor layers 212 in the bit line region are continuously distributed along the third direction D3 but are not divided.

In some embodiments, a material of the semiconductor layer 212 is a silicon material including doped ions, and a material of the first sacrificial layer 211 is silicon germanium. The doped ions may be, but are not limited to, phosphorus ions. The semiconductor layer 212 is formed by the silicon material including the doped ions, such that doping is not required when a channel region, a source region and a drain region in a transistor are formed subsequently, thereby simplifying processes for forming the semiconductor structure. There is higher etching selectivity between the silicon material including the doped ions and the silicon germanium material, thereby facilitating subsequent selective removal of the first sacrificial layer 211 without causing damage to the semiconductor layer 212.

Figure 2H:
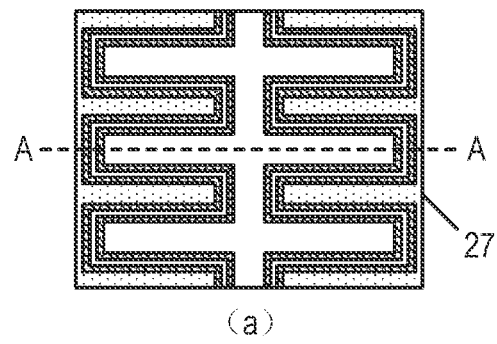
Figure 2H:
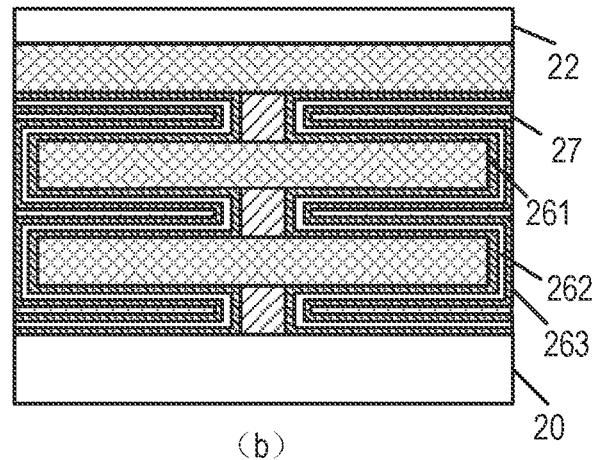
Figure 2I:
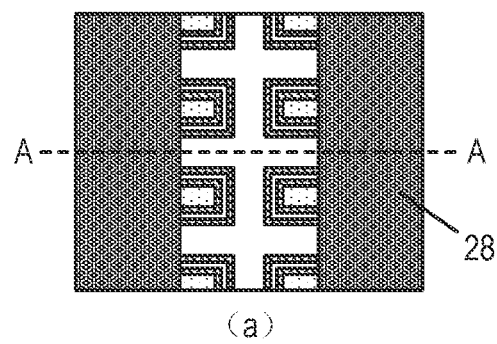
Figure 2I:
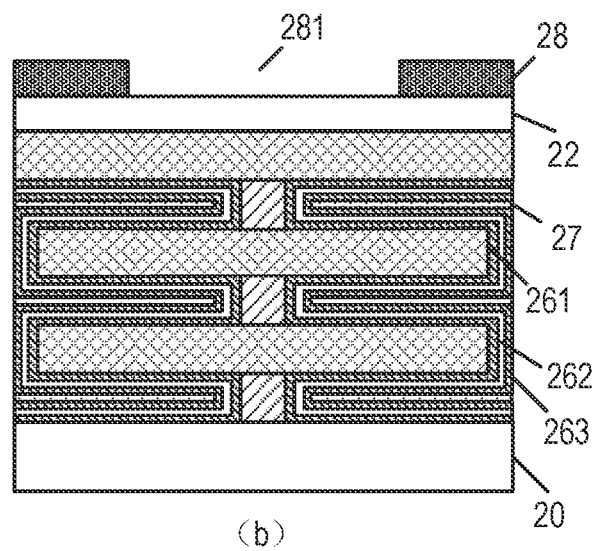

Step S12: forming a capacitor extending along the second direction D2 between adjacent two of the plurality of semiconductor layers 212 in the capacitor region, as shown in FIG. 2H, where (a) in FIG. 2H is a schematic structural top view, and (b) in FIG. 2H is a schematic cross-sectional view of (a) at AA.

In some embodiments, the step of forming a capacitor extending along the second direction D2 between adjacent two of the plurality of semiconductor layers 212 in the capacitor region includes:
  removing the first sacrificial layer 211 from the capacitor region and the transistor region to form a first void 25 between adjacent two of the plurality of semiconductor layers 212 positioned in the capacitor region, and a second void 32 between adjacent two of the plurality of semiconductor layers 212 positioned in the transistor region, as shown in FIG. 2E, where (a) in FIG. 2E is a schematic structural top view, and (b) in FIG. 2E is a schematic cross-sectional view of (a) at AA.

In some embodiments, the stacked layer 21 includes two transistor regions distributed on two opposite sides of the bit line region along the second direction D2, and a side of one of the two transistor regions away from the bit line region is provided with the capacitor region. The step of removing the first sacrificial layer 211 from the capacitor region and the transistor region includes:
  removing the first sacrificial layer 211 from all of the capacitor regions and all of the transistor regions.

In some embodiments, the step of removing the first sacrificial layer 211 from the capacitor region and the transistor region includes:
  forming the second sacrificial layer covering the top surface of the stacked layer 21; and removing the first sacrificial layer 211 from the capacitor region and the transistor region by means of a lateral etching process.

In some embodiments, one of the bit line regions is arranged in the stacked layer 21, one of the transistor regions is arranged on each of two opposite sides of the bit line region along the second direction D2, and one capacitor region is arranged on a side of each of the transistor regions away from the bit line region, such that two transistors formed subsequently can share one bit line. In this way, the size of the semiconductor structure can be further reduced, and the integration of the semiconductor structure is increased. By forming the second sacrificial layer covering the top surface of the stacked layer 21, it is avoidable to cause damage to the semiconductor layer 212 at the top of the stacked layer 21 by the etching processes. The first sacrificial layer 211 in the capacitor region and the transistor region is removed by means of the lateral etching process, such that no mask needs to be formed, thus fabrication processes of the semiconductor structure is simplified, and manufacturing costs of the semiconductor structure is reduced.

Figure 2J:
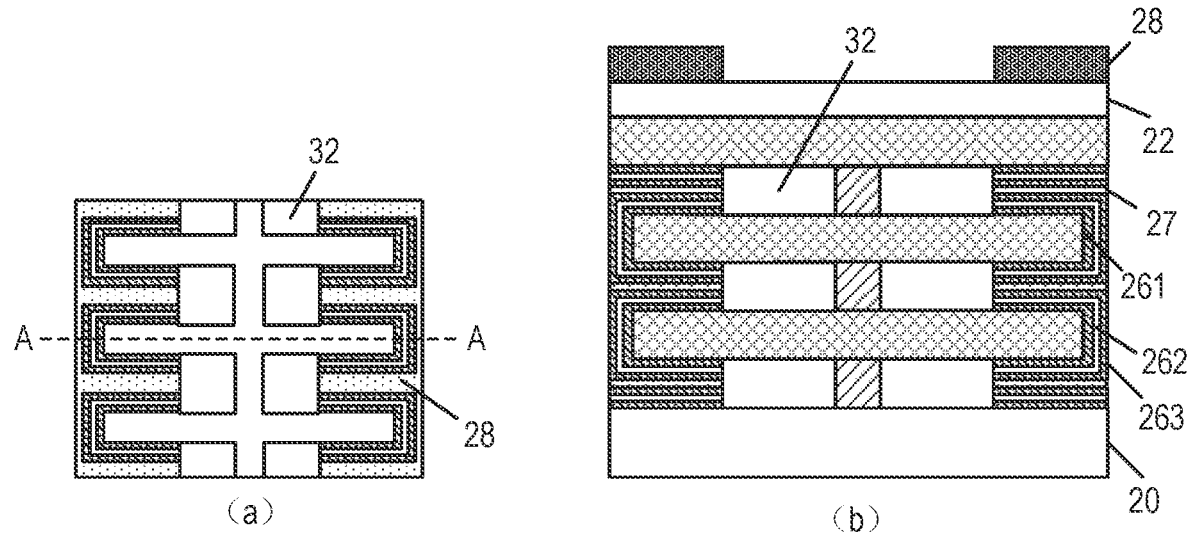
Figure 2K:
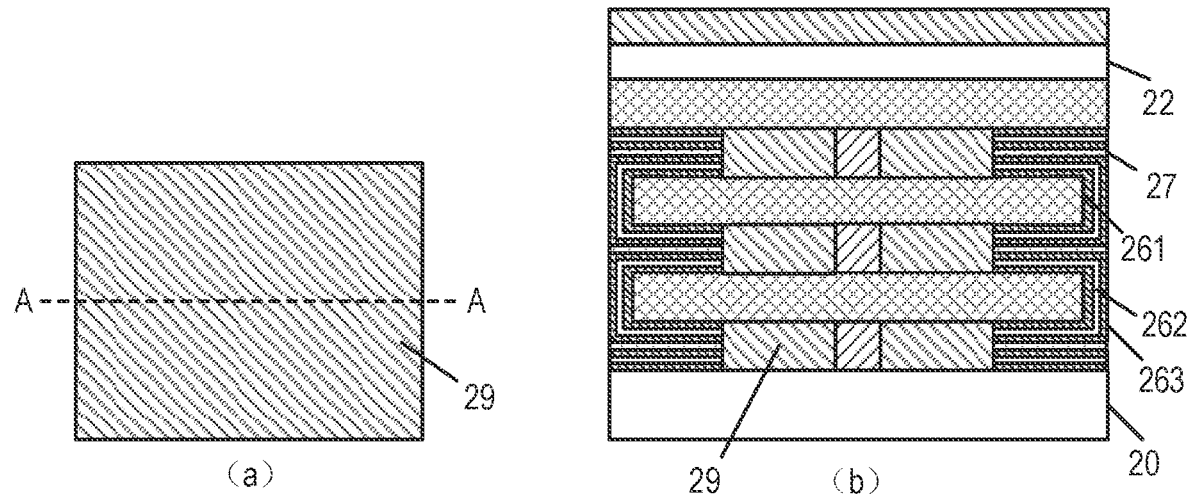
Figure 2L:
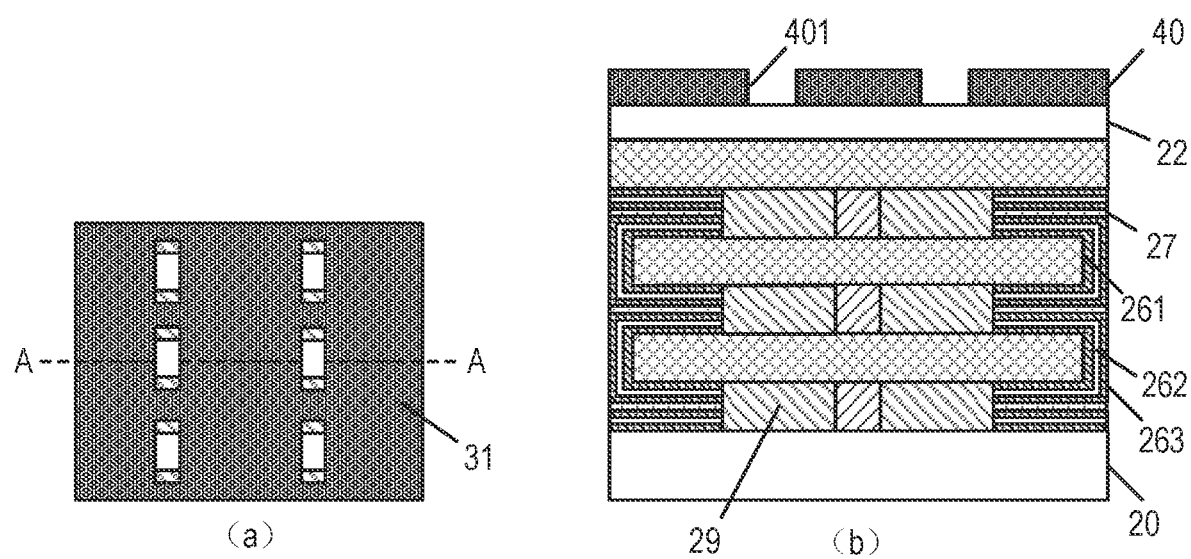
Figure 2M:
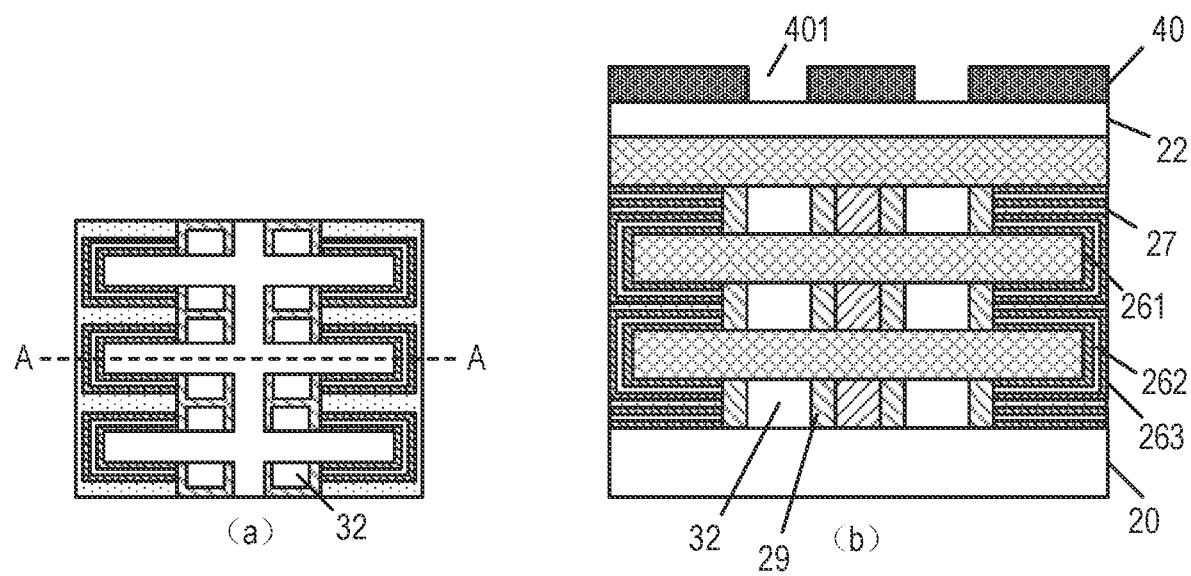
Figure 2N:
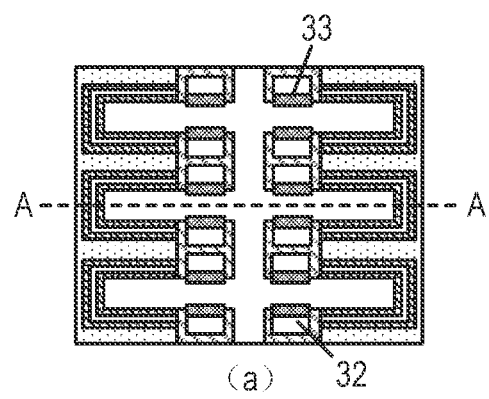
Figure 2N:
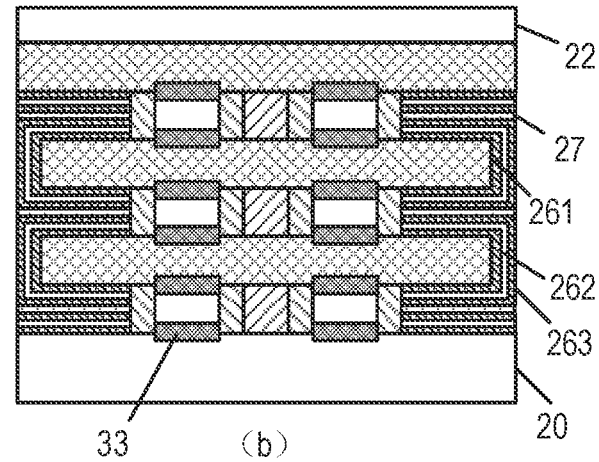

In some embodiments, the first void 25 communicates with the second void 32. The step of forming a capacitor extending along the second direction D2 between adjacent two of the plurality of semiconductor layers 211 in the capacitor region includes:

forming a lower electrode layer 261 continuously covering an inner wall of the first void 25 and an inner wall of the second void 32;

forming a dielectric layer 262 covering a surface of the lower electrode layer 261;

forming an upper electrode layer 263 covering a surface of the dielectric layer 262, as shown in FIG. 2F, where (a) in FIG. 2F is a schematic structural top view, and (b) in FIG. 2F is a schematic cross-sectional view of (a) at AA;

forming a common electrode layer 27 covering a surface of the upper electrode layer 263, as shown in FIG. 2H; and removing the lower electrode layer 261, the dielectric layer 262, the upper electrode layer 263 and the common electrode layer 27 positioned in the second void 32, where the lower electrode layer 261, the dielectric layer 262, the upper electrode layer 263 and the common electrode layer 27 remained in the first void 25 form the capacitor. As shown in FIG. 2J, (a) in FIG. 2J is a schematic structural top view, and (b) in FIG. 2J is a schematic cross-sectional view of (a) at AA.

In some embodiments, the lower electrode layer 261 continuously covering the inner wall of the first void 25, the inner wall of the second void 32 and the top surface of the second pad layer 23 may be formed by means of the lateral deposition process, and the dielectric layer 262 covering the surface of the lower electrode layer 261 and the upper electrode layer 263 covering the surface of the dielectric layer 262 are also formed. A material of the lower electrode layer 261 and a material of the upper electrode layer 262 may be a conductive material such as TiN or tungsten, and a material of the dielectric layer 262 may be a material with a higher dielectric constant (HK). For example, the material of the dielectric layer 262 may include hafnium oxide ($HfO_2$), hafnium silicon oxide ($HfSiO_2$), lanthanum oxide (LaO), zirconium oxide ($ZrO_2$), zirconium silicon oxide ($ZrSiO_2$), tantalum oxide ($Ta_2O_5$), titanium oxide ($TiO_2$), barium strontium titanium oxide ($BaSrTiO_3$), barium titanium oxide ($BaTiO_3$), strontium titanium oxide ($SrTiO_3$, STO), lithium oxide ($Li_2O$), aluminum oxide ($Al_2O_3$), lead scandium tantalum oxide (PbScTaO), lead zinc niobate ($PbZnNbO_3$), or a combination thereof. Next, a conductive material such as polysilicon is deposited on the surface of the upper electrode layer 263 to form the common electrode layer 27. As shown in FIG. 2G, (a) in FIG. 2G is a schematic structural top view, and (b) in FIG. 2G is a schematic cross-sectional view of (a) at AA. After the common electrode layer 27, the upper electrode layer 263, the dielectric layer 262, the lower electrode layer 261 and the second pad layer 23 positioned above the stacked layer 21 are removed, a structure as shown in FIG. 2H is obtained.

Next, a patterned second photoresist layer 28 is formed on the surface of the first pad layer 22, and the second photoresist layer 28 has a second opening 281 therein exposing the first pad layer 22 and the capacitor. As shown in FIG. 2I, (a) in FIG. 2I is a schematic structural top view, and (b) in FIG. 2I is a schematic cross-sectional view of (a) at AA. The lower electrode layer 261, the dielectric layer 262, the upper electrode layer 263 and the common electrode layer 27 positioned in the second void 32 are removed along the second opening 281, and the lower electrode layer 261, the dielectric layer 262, the upper electrode layer 263 and the common electrode layer 27 remained in the first void 25 form the capacitor, as shown in FIG. 2J.

Figure 2O:
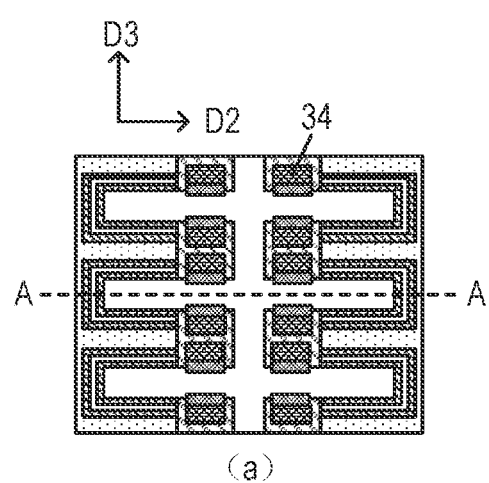
Figure 2O:
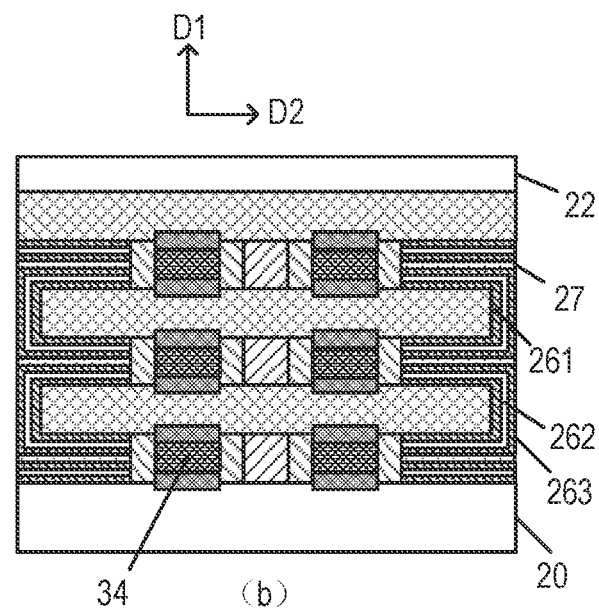

Step S13: forming a word line 34 in the transistor region, where the word line 34 extends along the first direction D1 and continuously wraps the plurality of semiconductor pillars 30 spaced along the first direction D1, as shown in FIG. 2O, (a) in FIG. 2O is a schematic structural top view, and (b) in FIG. 2O is a schematic cross-sectional view of (a) at AA.

In some embodiments, each of the semiconductor pillars 30 positioned in the transistor region includes a channel region, and a source region and a drain region distributed on two opposite sides of the channel region along the second direction D2, where the source region is adjacent to the bit line region, and the drain region is adjacent to the capacitor region. The step of forming a word line 34 in the transistor region includes:

forming a first spacer 29 covering the source region and the drain region in the second void 32; and forming the word line 34 in the second void 32, where the word line 34 extends along the first direction D1 and continuously wraps the channel regions spaced along the first direction D1.

In some embodiments, the step of forming a first spacer 29 covering the source region and the drain region in the second void 32 includes:

forming the first spacer 29 filling up the second void 32, as shown in FIG. 2K, where (a) in FIG. 2K is a schematic structural top view, and (b) in FIG. 2K is a schematic cross-sectional view of (a) at AA; and removing the first spacer 29 covering the channel region to expose the channel region, as shown in FIG. 2M, where (a) in FIG. 2M is a schematic structural top view, and (b) in FIG. 2M is a schematic cross-sectional view of (a) at AA.

In some embodiments, after the capacitor is formed, a low-dielectric-constant material is deposited in the second void 32 and on the surface of the first pad layer 22 to form the first spacer 29, as shown in FIG. 2K. Next, the first spacer 29 on the surface of the first pad layer 22 is removed, a patterned third photoresist layer 40 is formed on the surface of the first pad layer 22, and the third photoresist layer 40 has a third opening 401 therein exposing the first pad layer 22 and the first spacer 29, as shown in FIG. 2L. The first spacer 29 in the second void 32 is etched along the third opening 401 to expose the channel region in the transistor region, and the source region and the drain region are still covered by the first spacer 29, as shown in FIG. 2M.

In some embodiments, before forming the word line in the second void 32, the method further includes:

forming a gate dielectric layer 33 covering the channel region, as shown in FIG. 2N, where (a) in FIG. 2N is a schematic structural top view, and (b) in FIG. 2N is a schematic cross-sectional view of (a) at AA.

In some embodiments, after the channel region is exposed, the gate dielectric layer 33 may be formed on the surface of the channel region by means of an in-situ vapor growth process or a deposition process. A material of the gate dielectric layer 33 may be, but not limited to, an oxide material (such as silicon dioxide). Next, a conductive material such as tungsten may be deposited on a surface of the gate dielectric layer 33 by means of an atomic layer deposition process to form the word lines 34 extending along the first direction D1 and continuously wrapping a plurality of the channel regions spaced along the first direction D1, as shown in FIG. 2O.

Step S14: forming a bit line 38 in the bit line region, where the bit line 38 extends along the third direction D3 and covers the surface of the semiconductor layer 212. As shown in FIG. 2T, where (a) in FIG. 2T is a schematic structural top view, (b) in FIG. 2T is a schematic cross-sectional view of (a) at AA, and (c) in FIG. 2T is a cross-sectional schematic view of (a) at BB.

Figure 2P:
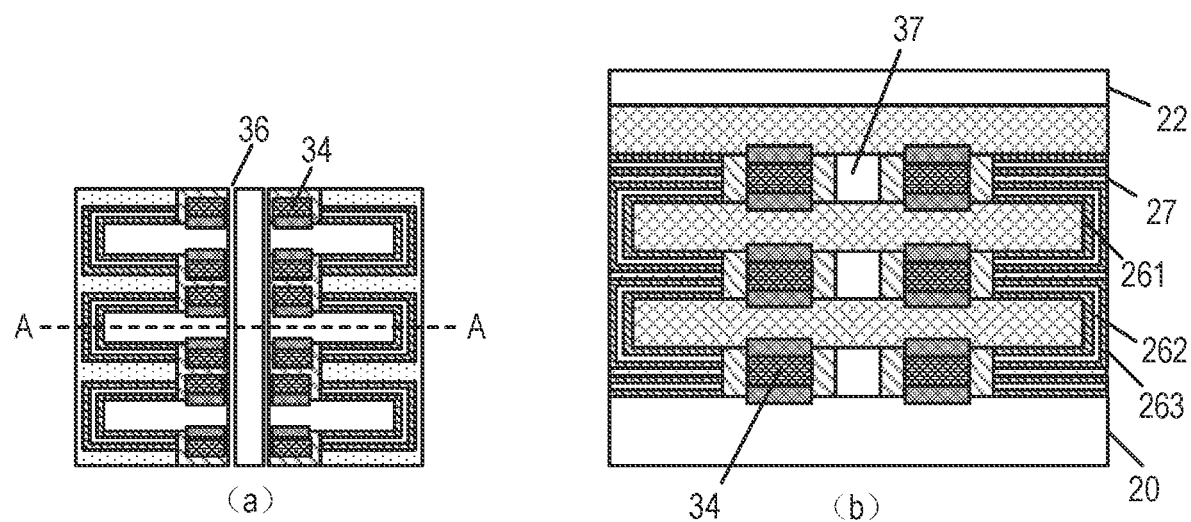

In some embodiments, before forming a bit line 38 in the bit line region, the method further includes:

removing the first sacrificial layer 211 in the bit line region by means of a lateral etching process to form a third void 37 between adjacent two of the plurality of semiconductor layers 212 positioned in the bit line region, as shown in FIG. 2P, where (a) in FIG. 2P is a schematic structural top view, and (b) in FIG. 2P is a schematic cross-sectional view of (a) at AA.

In some embodiments, after the word line 34 is formed, a patterned fourth photoresist layer may be formed on the surface of the first pad layer 22, where the fourth photoresist layer has a fourth opening therein exposing the first spacer 29 and the first pad layer 22 positioned above the bit line region. Down-etching is performed along the fourth opening to remove the first sacrificial layer 211 from the bit line region to form the third void 37 between two adjacent semiconductor layers 212 positioned in the bit line region, as shown in FIG. 2P.

In some embodiments, the step of forming a bit line 38 in the bit line region includes:

depositing a metal material on the surface of the semiconductor layer 212 along the third void, and forming the bit line 38 made of metal silicide; and annealing the bit line 38.

Figure 2Q:
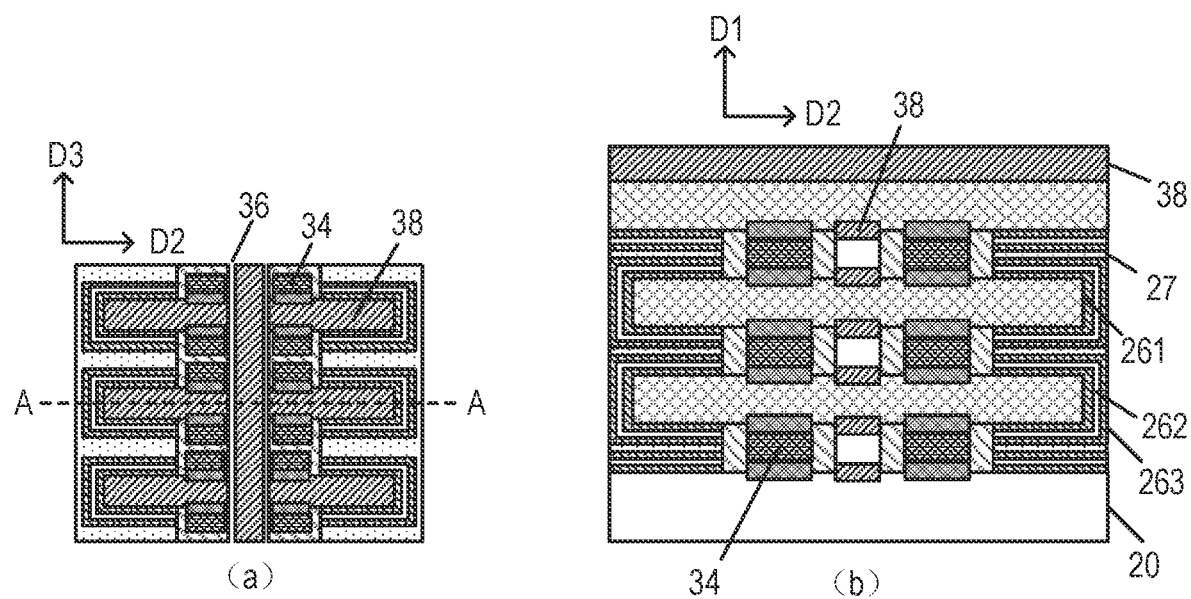

In some embodiments, the step of forming the bit line made of metal silicide includes:

depositing a metal material on an upper surface and a lower surface of the semiconductor layer 212 along the third void 37, where the lower surface is opposite to the upper surface, and the upper surface is a surface of the semiconductor layer 212 away from the substrate 20; and performing heat treatment on the stacked layer 21 to form the bit line 38, where the bit line 38 includes a first sub bit line covering the upper surface and a second sub bit line covering the lower surface, a thickness of the semiconductor layer 212 remained between the first sub bit line and the second sub bit line along the first direction D1 is smaller than a thickness of the semiconductor pillar 30 along the first direction D1. As shown in FIG. 2Q, (a) in FIG. 2Q is a schematic structural top view, and (b) in FIG. 2Q is a schematic cross-sectional view of (a) at AA.

Figure 2R:
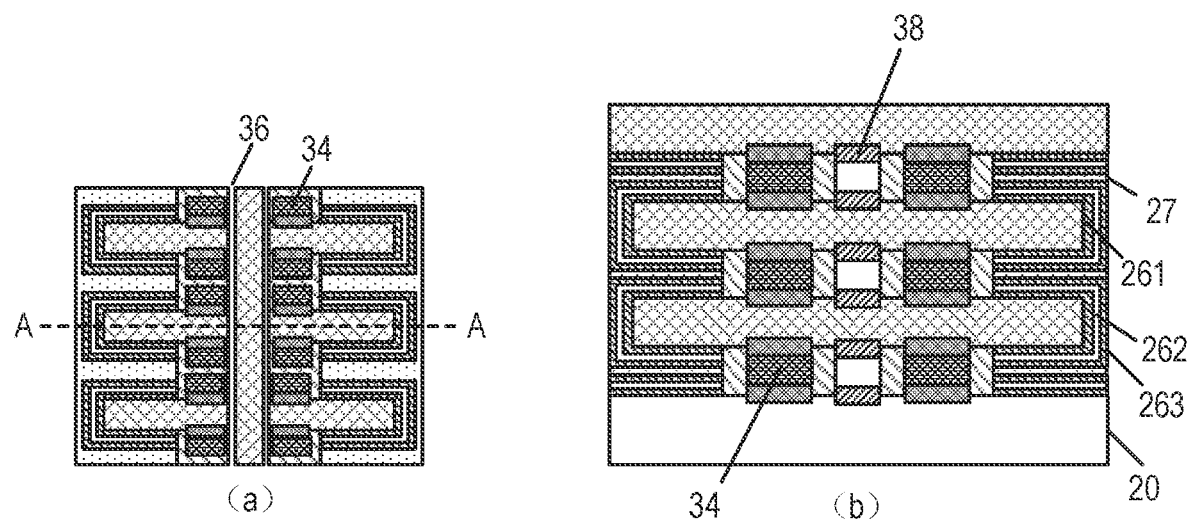

In some embodiments, after the first pad layer 22 is removed, a metal material such as Ti, Co, Ni or Pt is deposited on the upper surface and the lower surface of the semiconductor layer 212 in the bit line region along the third void 37, and low-temperature heat treatment is performed, such that the silicon material in the semiconductor layer 212 reacts with the metal material to generate high-resistance-state metal silicide. Next, the unreacted metal material in the third void 37 is removed, and the high-resistance-state metal silicide is subjected to high-temperature heat treatment, thereby forming the bit line 38 made of low-resistance-state metal silicide. Because the bit line 38 is obtained from the reaction between the semiconductor layer 212 and the metal material, the thickness of the semiconductor layer 212 positioned between the first sub bit line and the second sub bit line along the first direction D1 is smaller than the thickness of the semiconductor pillar 30 along the first direction D1. In this embodiment, the bit line is formed by the metal silicide, such that a resistance of the bit line 38 can be effectively reduced, thereby improving electrical performance of the semiconductor structure. After the bit line 38 covering the top surface of the stacked layer 21 is removed, a structure as shown in FIG. 2R is obtained, where (a) in FIG. 2R is a schematic structural top view, and (b) in FIG. 2R is a schematic cross-sectional view of (a) at AA.

Figure 2S:
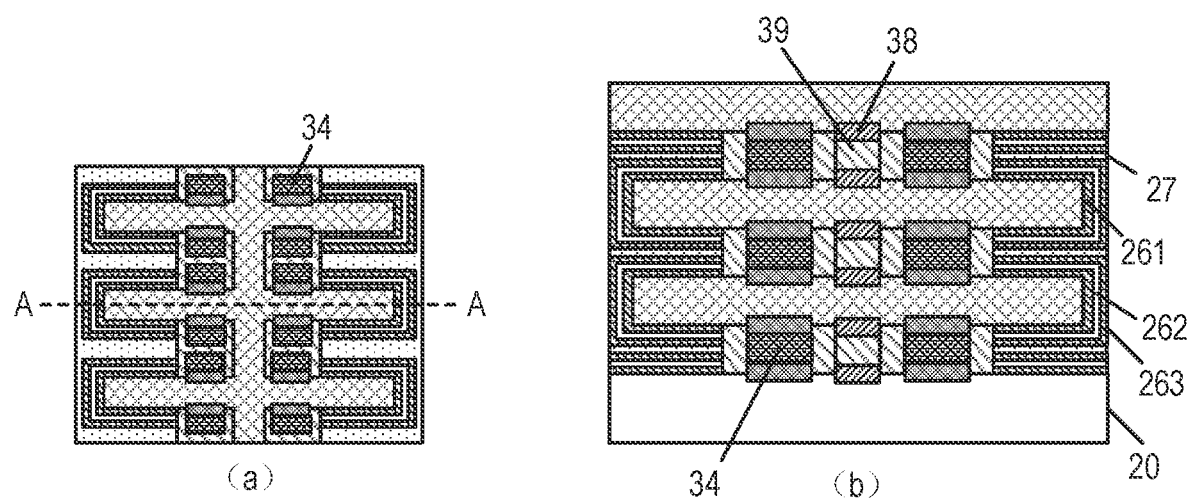
Figure 2T:
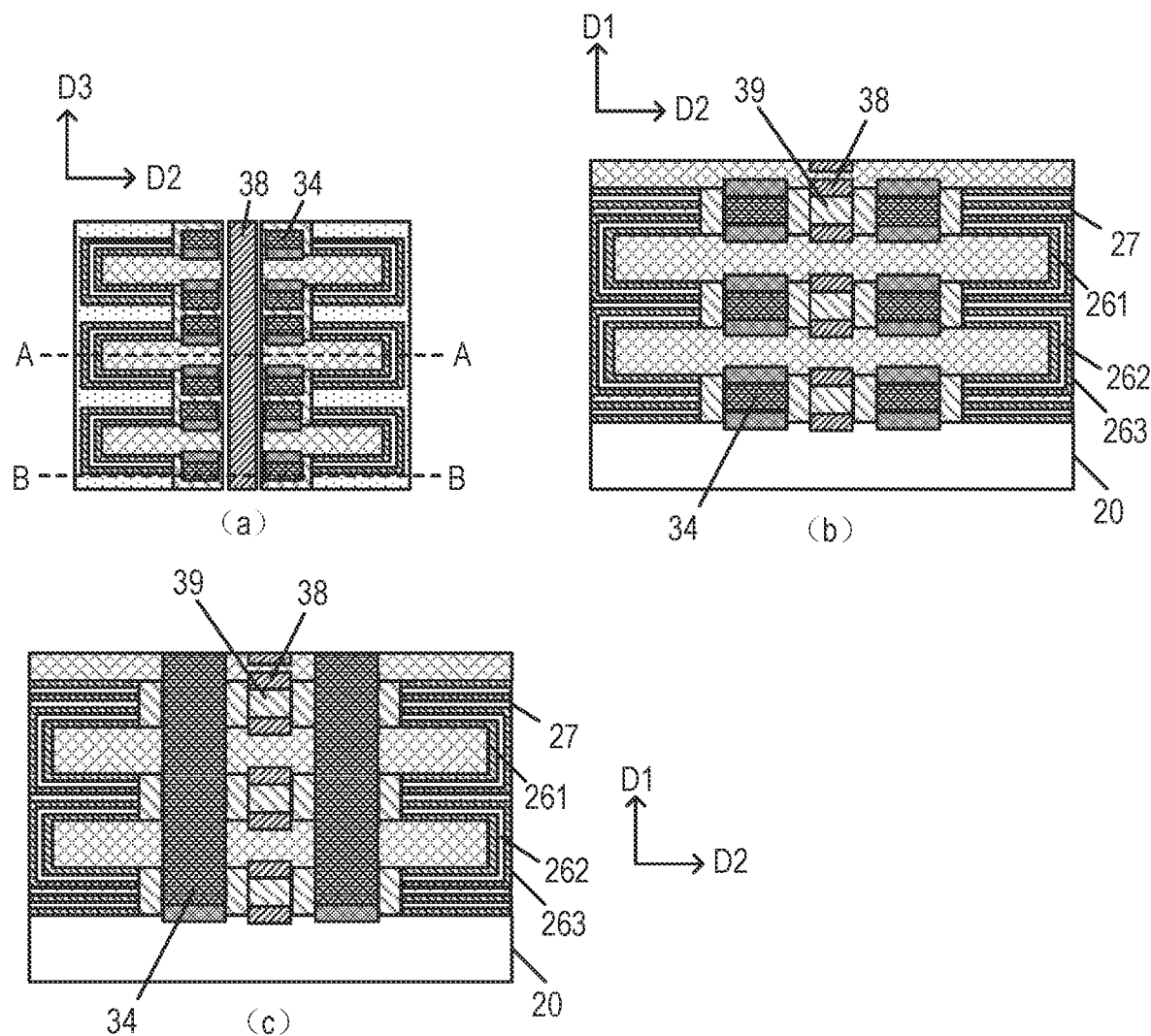

In some embodiments, after forming a bit line 38 in the bit line region, the method further includes:

forming a second spacer 39 positioned between adjacent two of the bit lines 38, as shown in FIG. 2S, where (a) in FIG. 2S is a schematic structural top view, and (b) in FIG. 2S is a schematic cross-sectional view of (a) at AA.

In some embodiments, after the bit line 38 is formed, a low-dielectric-constant material is deposited in the third void 37 to form the second spacer 39 configured to isolate the adjacent bit lines 38. In this embodiment, the second spacer 39 is formed by the low-dielectric-constant material, such that parasitic capacitance of the semiconductor structure can be reduced, and signal crosstalk of the semiconductor structure can be reduced, thereby allowing interconnection lines to be closer, and providing a space for increasing integration of a chip. In addition, by reducing a value of a dielectric medium k (i.e., dielectric constant), signal propagation delay may be shortened, thereby increasing speed of the chip. Next, the stacked layer 21 is etched using the bit line 38 as an etching medium layer to expose the bit line 38, such that a signal of the bit line 38 may be led out subsequently.

This embodiment further provides a semiconductor structure, which is formed by the above method for forming a semiconductor structure described in any one of the above embodiments. A schematic diagram of the semiconductor structure provided by this embodiment may be referred to FIG. 2T.

According to the semiconductor structure and the formation method thereof provided by some embodiments of the present disclosure, a stacked layer is formed on a top surface of a substrate, where the stacked layer includes a plurality of semiconductor layers spaced along a direction perpendicular to the top surface of the substrate, and each of the plurality of semiconductor layers includes a plurality of semiconductor pillars spaced along a direction parallel to the top surface of the substrate, such that the plurality of semiconductor pillars in the stacked layer are stacked in a three-dimensional array. Subsequently, a horizontal capacitor, a vertical word line and a horizontal bit line are formed for transforming a conventional two-dimensional semiconductor structure into a three-dimensional semiconductor structure. In this way, the integration of the semiconductor structure is improved, and the storage density of the semiconductor structure can be increased, thereby improving the performance of the semiconductor structure. In addition, in this embodiment, the plurality of bit lines extend in the direction parallel to the top surface of the substrate, and the plurality of bit lines are spaced along the direction perpendicular to the top surface of the substrate, such that the plurality of bit lines may be formed by a variety of materials, and resistances of the bit lines are reduced while flexibility of fabrication procedures is enhanced for the bit lines, thereby further improving the performance of the semiconductor structure.

The above merely are embodiments of the present disclosure. It is to be pointed out that to those of ordinary skill in the art, various improvements and embellishments may be made without departing from the principles of the present disclosure, and these improvements and embellishments are also deemed to be within the scope of protection of the present disclosure.

What is claimed is:

1. A method for forming a semiconductor structure, comprising:
    forming a stacked layer on a top surface of a substrate, the stacked layer comprising a plurality of semiconductor layers spaced along a first direction, the stacked layer comprising a transistor region, and a capacitor region and a bit line region distributed on two opposite sides of the transistor region along a second direction, each of the plurality of semiconductor layers in the transistor region and the capacitor region comprising semiconductor pillars spaced along a third direction, the first direction being a direction perpendicular to the top surface of the substrate, both the second direction and the third direction being directions in parallel to the top surface of the substrate, and the second direction intersecting with the third direction;
    forming a capacitor extending along the second direction between adjacent two of the plurality of semiconductor layers in the capacitor region;
    forming a word line in the transistor region, the word line extending along the first direction and continuously wrapping the semiconductor pillars spaced along the first direction; and
    forming a bit line in the bit line region, the bit line extending along the third direction and covering a surface of a given one of the plurality of semiconductor layers, wherein the forming the stacked layer on a top surface of a substrate comprises:
    provides the substrate;
    alternately forming a first sacrificial layer and the given semiconductor layer on the top surface of the substrate along the first direction to form the stacked layer; and
    etching the transistor region and the capacitor region of the stacked layer to form a plurality of first trenches exposing the substrate, and the plurality of first trenches dividing the plurality of semiconductor layers in the transistor region and the capacitor region into the semiconductor pillars spaced along the third direction;
    wherein a material of the given semiconductor layer is a silicon material comprising doped ions, and a material of the first sacrificial layers is silicon germanium.

2. The method for forming a semiconductor structure according to claim 1, wherein the forming the capacitor extending along the second direction between adjacent two of the plurality of semiconductor layers in the capacitor region comprises:
    removing the first sacrificial layer from the capacitor region and the transistor region to form a first void between adjacent two of the plurality of semiconductor layers positioned in the capacitor region, and a second void between adjacent two of the plurality of semiconductor layers positioned in the transistor region.

3. The method for forming a semiconductor structure according to claim 2, wherein the stacked layer comprises two transistor regions distributed on two opposite sides of the bit line region along the second direction, and a side of one of the two transistor regions away from the bit line region is provided with the capacitor region; and the removing the first sacrificial layer from the capacitor region and the transistor region comprises:
    removing the first sacrificial layer from all of the capacitor regions and all of the transistor regions.

4. The method for forming a semiconductor structure according to claim 2, wherein the removing the first sacrificial layer from the capacitor region and the transistor region comprises:
    forming a second sacrificial layer covering a top surface of the stacked layer; and
    removing the first sacrificial layer from the capacitor region and the transistor region by means of a lateral etching process.

5. The method for forming a semiconductor structure according to claim 2, wherein the first void communicates with the second void; and the forming the capacitor extending along the second direction between adjacent two of the plurality of semiconductor layers in the capacitor region comprises:
    forming a lower electrode layer continuously covering an inner wall of the first void and an inner wall of the second void;
    forming a dielectric layer covering a surface of the lower electrode layer;
    forming an upper electrode layer covering a surface of the dielectric layer;
    forming a common electrode layer covering a surface of the upper electrode layer; and
    removing the lower electrode layer, the dielectric layer, the upper electrode layer and the common electrode layer positioned in the second void, and the lower electrode layer, the dielectric layer, the upper electrode layer and the common electrode layer remained in the first void forming the capacitor.

6. The method for forming a semiconductor structure according to claim 2, wherein each of the semiconductor pillars positioned in the transistor region comprises a channel region, and a source region and a drain region distributed on two opposite sides of the channel region along the second direction, the source region being adjacent to the bit line region, and the drain region being adjacent to the capacitor region; and the forming the word line in the transistor region comprises:
    forming a first spacer covering the source region and the drain region in the second void; and
    forming the word line in the second void, the word line extending along the first direction and continuously wrapping the channel regions spaced along the first direction.

7. The method for forming a semiconductor structure according to claim 6, wherein the forming the first spacer covering the source region and the drain region in the second void comprises:
   forming the first spacer filling up the second void; and
   removing the first spacer covering the channel region to expose the channel region.

8. The method for forming a semiconductor structure according to claim 6, wherein before forming the word line in the second void, the method further comprises:
   forming a gate dielectric layer covering the channel region.

9. The method for forming a semiconductor structure according to claim 2, wherein before forming a bit line in the bit line region, the method further comprises:
   removing the first sacrificial layer in the bit line region by means of a lateral etching process to form a third void between adjacent two of the plurality of semiconductor layers positioned in the bit line region.

10. The method for forming a semiconductor structure according to claim 9, wherein the forming the bit line in the bit line region comprises:
    depositing a metal material on the surface of the given semiconductor layer along the third void, and forming the bit line made of metal silicide; and
    annealing the bit line.

11. The method for forming a semiconductor structure according to claim 10, wherein the forming the bit line made of metal silicide comprises:
    depositing a metal material on an upper surface and a lower surface of the given semiconductor layer along the third void, the lower surface being opposite to the upper surface, and the upper surface being a surface of the given semiconductor layer away from the substrate; and
    performing heat treatment on the stacked layer to form the bit line, the bit line comprising a first sub bit line covering the upper surface and a second sub bit line covering the lower surface, a thickness of the given semiconductor layer remained between the first sub bit line and the second sub bit line along the first direction being smaller than a thickness of the semiconductor pillar along the first direction.

12. The method for forming a semiconductor structure according to claim 1, wherein after the forming the bit line in the bit line region, the method further comprises:
    forming a second spacer positioned between adjacent two of the bit lines.

* * * * *